US008421519B2

(12) United States Patent
Debnath et al.

(10) Patent No.: US 8,421,519 B2
(45) Date of Patent: Apr. 16, 2013

(54) SWITCHED CHARGE STORAGE ELEMENT NETWORK

(75) Inventors: Chandrajit Debnath, Greater Noida (IN); Anubhuti Rangbulla, Delhi (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 437 days.

(21) Appl. No.: 12/615,991

(22) Filed: Nov. 10, 2009

(65) Prior Publication Data

US 2010/0117710 A1 May 13, 2010

(30) Foreign Application Priority Data

Nov. 11, 2008 (IN) .......................... 2559/DEL/2008

(51) Int. Cl.
*H03K 5/00* (2006.01)

(52) U.S. Cl.
USPC .......................................... 327/336; 327/554

(58) Field of Classification Search .......... 327/551–559, 327/336–337, 94
See application file for complete search history.

(56) References Cited

U.S. PATENT DOCUMENTS

| | | | | |
|---|---|---|---|---|
| 5,680,070 | A * | 10/1997 | Anderson et al. | 327/336 |
| 5,729,232 | A * | 3/1998 | Fujimori | 341/172 |
| 7,633,327 | B1 * | 12/2009 | Zhang et al. | 327/337 |
| 7,636,056 | B2 * | 12/2009 | Inukai et al. | 341/143 |
| 8,217,815 | B2 * | 7/2012 | Chen et al. | 341/143 |

* cited by examiner

*Primary Examiner* — Dinh T. Le
(74) *Attorney, Agent, or Firm* — Seed IP Law Group PLLC

(57) ABSTRACT

A switched charge storage element integrator in a continuous or discrete time circuit, the integrator including a differential input amplifier, a first 2-terminal charge storage element, a second 2-terminal charge storage element, and a plurality of controlled switches. The differential input amplifier is coupled to a capacitor and a resistor and configured as an inverting integrator. An inverting terminal of the amplifier is coupled to two controlled switches. A non-inverting terminal of the amplifier is coupled to a reference voltage. The first and second switched charge storage element blocks are alternatingly coupled to the inverting terminal INM of the amplifier XOPA during the active state of a second clock signal and a first clock signal, respectively, for making the supply noise continuous and eliminating its dependency on the clock phases, thereby zeroing its convolution with the clock signal.

15 Claims, 10 Drawing Sheets

SWITCHED CHARGE STORAGE ELEMENT NETWORK

BACKGROUND

1. Technical Field

The present disclosure relates to the field of switched charge storage element networks and, more specifically, to switched charge storage element integrators.

2. Description of the Related Art

Switched charge storage element networks i.e., switched capacitor networks are widely used to perform several functions. One application of a switched capacitor network is sigma delta modulators. Sigma delta modulators encode high resolution signals into low resolution signals using pulse-density modulation, and they are used in various modern electronic devices, such as analog-to-digital and digital-to-analog converters, frequency synthesizers, switched-mode power supplies, and motor controls. There are predominantly two approaches for realizing sigma delta modulators, namely, discrete time architecture and continuous time architecture. Discrete time modulators have some advantages over their continuous time counterparts in terms of robustness with process variation, tolerance towards clock jitter, and feasibility to cascade multiple modulators to form multistage (MASH) architecture. However, discrete time modulators being sampled data systems require an anti-aliasing filter, which consumes substantial amount of silicon area. The continuous time modulators do not require an anti-aliasing filter and hence are a promising proposition for low area solution. However, continuous time modulators suffer from limitations of clock jitter sensitivity and rise/fall transients of feedback DAC. To address the issues arising as above, a hybrid of continuous time and discrete time architectures provides a discrete time switched capacitor DAC that replaces the continuous time feedback DAC in the modulator.

FIG. 1 illustrates a conventional second order sigma delta (ΣΔ) modulator 100. The ΣΔ modulator 100 includes two integrators 101, a quantizer and feedback DACs. The ΣΔ modulator also includes two subtractors to form the basic building block.

FIG. 2 illustrates a conventional schematic diagram of an integrator 200. The integrator 200 includes an operational amplifier XOPA, capacitors (Ci, C1), resistors (Ri, R1), and switches (S1, S2, S3, S4). Integrating capacitor Ci is coupled between the input terminal INM and the output node OUT of operational amplifier XOPA. The reference voltage node VCM coupled to the input terminal INP, acts as small signal analog ground. Resistor Ri is coupled between terminal INM and an analog input node $V_{IN}$. The top plate of capacitor C1 is coupled to terminal INM through a switch S1 that switches "ON" during phase PH1 active. The top plate is also coupled to reference voltage node VCM through switch S2 which switches "ON" during phase PH2 active. The bottom plate of C1 is coupled to reference voltage node VCM through series resistor R1 and switch S3, which switches "ON" during phase PH1 active. The bottom plate is also connected to the output of a local DAC through switch S4, which switches "ON" during phase PH2 active. In particular, during phase PH2 active, top plate of capacitor $C_1$ is coupled to reference voltage VCM, while its bottom plate samples the DAC output. During phase PH1 active, the top plate of C1 is coupled to the input terminal INM of the operational amplifier while its bottom plate is coupled to VCM through resistor R1. Hence during phase PH1 active, $C_1$ transfers a charge approximating $C_1 * V_{DACOUT}$ to the integrating capacitor $C_i$, where $V_{DACOUT}$ is the output voltage of the feedback DAC.

The time period of phase PH1 and phase PH2 is denoted as T and rising edge of PH2 is assumed as the beginning of a sample phase in the rest of the background disclosure.

Assuming $R_1 * C_i << T$ at the end of sample phase 'n', the output of integrator is approximated as:

$$V_{OUT}[n] = \left(\frac{C_1}{C_i}\right) \times \sum_{i=1}^{n} V_{DACOUT}[i] + \frac{1}{(R_i C_i)} \int V_{IN}(t) dt \tag{1}$$

Equation (1) denotes the basic operation of the integrator used inside a continuous time sigma delta modulator with discrete time feedback.

FIG. 3 illustrates an integrator circuit 300 equivalent to the conventional integrator 200 during the phase PH2 active. The capacitor C1, shown in FIG. 2, is not coupled to the terminal INM during phase PH2 active and hence has been removed from FIG. 3. The supply noise is introduced by means of a random noise source $V_n(t)$ applied at positive input terminal INP of the operational amplifier XOPA.

By mathematical manipulation it is clear that the equivalent noise source referred at VIN during phase PH2 is approximated by the equation:

$$V_{neqph2}(t) = V_n(t) + (R_i C_i) \frac{d}{dt} V_n(t) \tag{2}$$

FIG. 4 illustrates the integrator circuit 400 equivalent to the conventional integrator 200 during the phase PH1 active. Switch 51 is ON and couples the top terminal of capacitor C1 to terminal INM. The bottom plate of capacitor C1 is coupled to the reference voltage VCM.

By mathematical manipulation, the equivalent noise source at VIN during phase PH1 is:

$$V_{neqph1}(t) = V_n(t) \times (1 + C_i / C_1) + (R_i C_i) \frac{d}{dt} V_n(t) \tag{3}$$

Using equations (2) and (3):

Total equivalent noise at VIN is:

$$\begin{aligned} V_{neq}(t) &= V_{neqph2}(t) \times U(PH2) + V_{neqph1}(t) \times U(PH1) \\ U(PH2) &= 0 \text{ when } PH2 \text{ is LOW} \\ &= 1 \text{ when } PH2 \text{ is HIGH} \\ U(PH1) &= 0 \text{ when } PH1 \text{ is LOW} \\ &= 1 \text{ when } PH1 \text{ is HIGH} \end{aligned} \tag{4}$$

Since PH1 and PH2 are non-overlapping clocks, equation (4) is re-written as $$V_{neq}(t) = V_n(t) + (R_i C_i) \frac{d}{dt} V_n(t) + U(PH1) \times (V_n(t) \times C_i / C_1) \tag{5}$$

By analyzing equation (5), it is observed that total equivalent noise has two components:

First component, $$V_n(t) + (R_i C_i)\frac{d}{dt}V_n(t),$$

is a linear function of $V_n(t)$ and its derivative. Hence, if the noise has any base band component it will remain in ADC baseband and out of band component will remain out of band.)

But the component $U(PH1)\times(V_n(t)\times C_i/C_i)$ is effectively the convolution of two signals $V_n(t)$ and clock signal PH1 in the frequency domain.

The spectrum of $V_n(t)$ convolves with spectrum of clock PH1 which results in out of band frequencies folding back in the ADC baseband.

If the frequency of clock signal during PH1 is $f_0$ and W is a frequency less than the maximum base band frequency, then any noise present in $V_n(t)$ at frequency $f_0+W$ would fold back to the base band frequency W.

BRIEF SUMMARY

In accordance with the present disclosure, a system is provided that includes a differential input amplifier configured as an inverting integrator having an inverting terminal; a first switched charge storage element block structured to be periodically coupled to the inverting terminal of the amplifier by a coupling device; and a second switched charge storage element block identical to the first switched charge storage element block and structured to be periodically coupled to the inverting terminal by a coupling device, wherein whenever the first switched charge storage element block is decoupled from the inverting terminal, the second switched charge storage element block is coupled to the inverting terminal, and whenever the first switched charge storage element block is coupled to the inverting terminal, the second switched charge storage element block is decoupled from the inverting terminal.

In accordance with another aspect of the foregoing system, the first switched charge storage element block includes a first 2-terminal charge storage element; a first controlled switch coupling the first terminal of the first charge storage element to an input signal during an active state of a first clock signal; a second controlled switch coupling the first terminal of the first charge storage element to a reference voltage during an active state of a second clock signal; and a third controlled switch coupling the second terminal of the first charge storage element to the reference voltage during the active state of the first clock signal.

In accordance with another aspect of the foregoing system, the second switched charge storage element block includes a second 2-terminal charge storage element; a fifth controlled switch coupling the first terminal of the second charge storage element to the reference voltage VCM during the active state of the second clock signal; a sixth controlled switch coupling the first terminal of said second charge storage element to the reference voltage during the active state of the first clock signal; and a seventh controlled switch coupling the second terminal of the second charge storage element to the reference voltage during the active state of the second clock signal.

In accordance with another aspect of the present disclosure, a sigma delta modulator is provided that includes a switched charge storage element integrator, the integrator including a differential input amplifier configured as an inverting integrator having an inverting terminal; a first switched charge storage element block periodically coupled to the inverting terminal of said amplifier by a first means for coupling; and a second switched charge storage element block periodically coupled to the inverting terminal by a second means for coupling the integrator configured such that whenever the first switched charge storage element block is decoupled from the inverting terminal, the second switched charge storage element block is coupled to the inverting terminal, and whenever the first switched charge storage element block is coupled to the inverting terminal, the second switched charge storage element block is decoupled from the inverting terminal.

In accordance with another aspect of the present disclosure, a switched charge storage element integrator is provided that includes a differential input amplifier configured as an inverting integrator having an inverting input; a first switched charge storage element block periodically coupled to the inverting terminal of said amplifier by a first means for coupling; and a second switched charge storage element block periodically coupled to the inverting terminal by a second means for coupling, such that whenever the first switched charge storage element block is decoupled from the inverting terminal, the second switched charge storage element block is coupled to the inverting terminal, and whenever the first switched charge storage element block is coupled to the inverting terminal, the second switched charge storage element block is decoupled from the inverting terminal.

In accordance with another aspect of the present disclosure, a method for avoiding convolution of supply noise with a clock signal in a switched charge storage element integrator is provided, the method including periodically coupling a first switched charge storage element block to an inverting terminal of the integrator; and coupling a second switched charge storage element block to the inverting terminal for the duration for which the first switched charge storage element block is decoupled from the inverting terminal.

In accordance with another aspect of the foregoing method, the method includes controlling first and second switches coupled to the inverting terminal and respectively to the first and second switched charge storage element blocks to alternatingly couple the first and second switched charge storage element blocks to the integrator.

In accordance with another aspect of the present disclosure, a circuit is provided that includes a switched charge storage element integrator including a differential input amplifier configured as an inverting integrator having an inverting terminal; first and second switched charge storage element circuits; and first and second coupling devices having first terminals coupled to the respective first and second switched charge storage element circuits and second terminals coupled to the inverting terminal of the inverting integrator and controlled to alternatingly couple the first and second switched charge storage element circuit to the differential input amplifier so that whenever the first switched charge storage element circuit is coupled to the inverting terminal of the inverting integrator, the second switched charge storage element circuit is decoupled from the inverting terminal of the inverting integrator and whenever the second switched charge storage element circuit is coupled to the inverting terminal of the inverting integrator, the first switched charge storage element circuit is decoupled from the inverting terminal of the inverting integrator.

BRIEF DESCRIPTION OF THE SEVERAL VIEWS OF THE DRAWINGS

The aforementioned aspects and other features of the present disclosure will be explained in the following description when taken in conjunction with the accompanying drawings, wherein.

DETAILED DESCRIPTION

Figure 1:
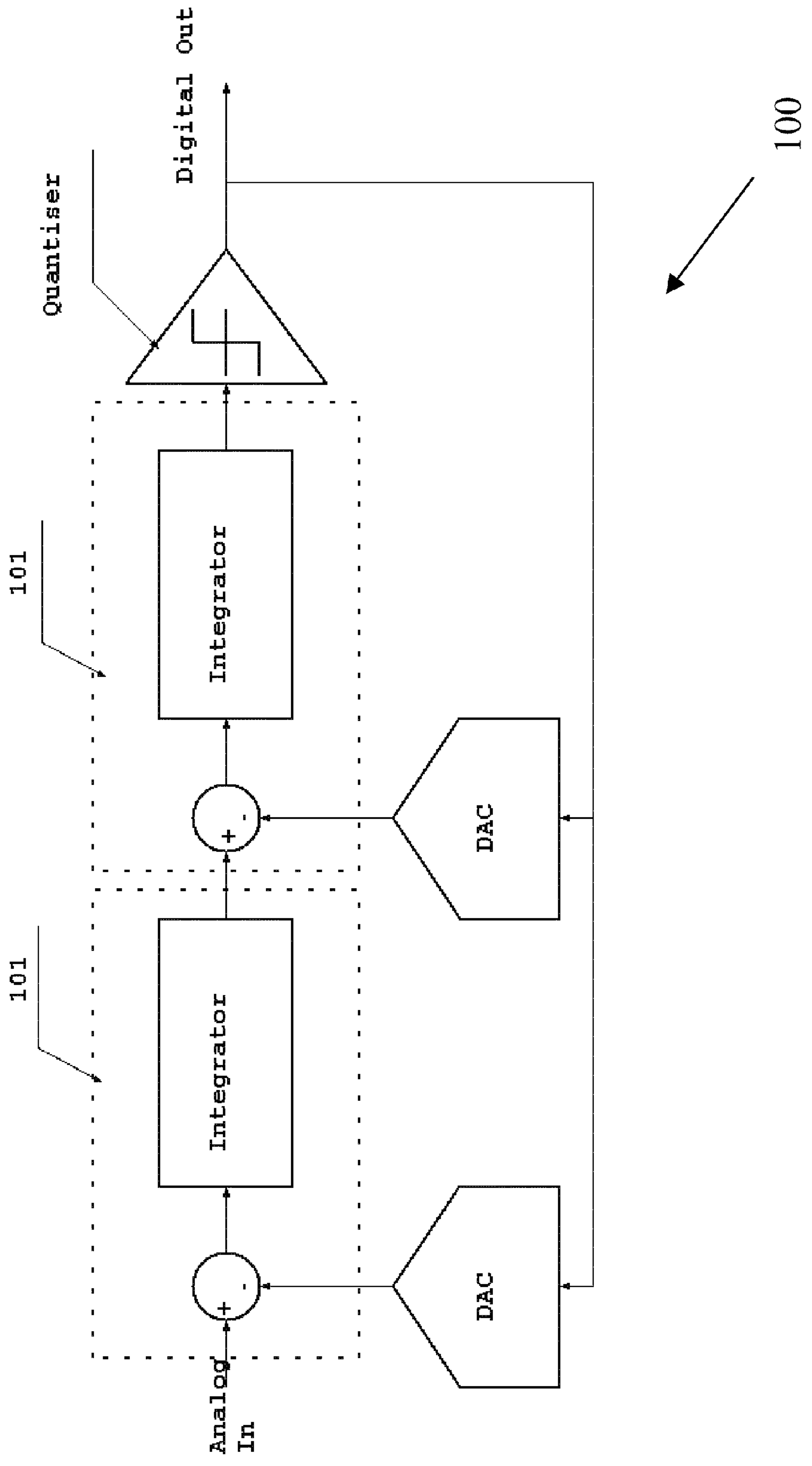
FIG. 1 (Prior Art)
FIG. 1 illustrates a conventional second order sigma delta (ΣΔ) modulator.
Figure 2:
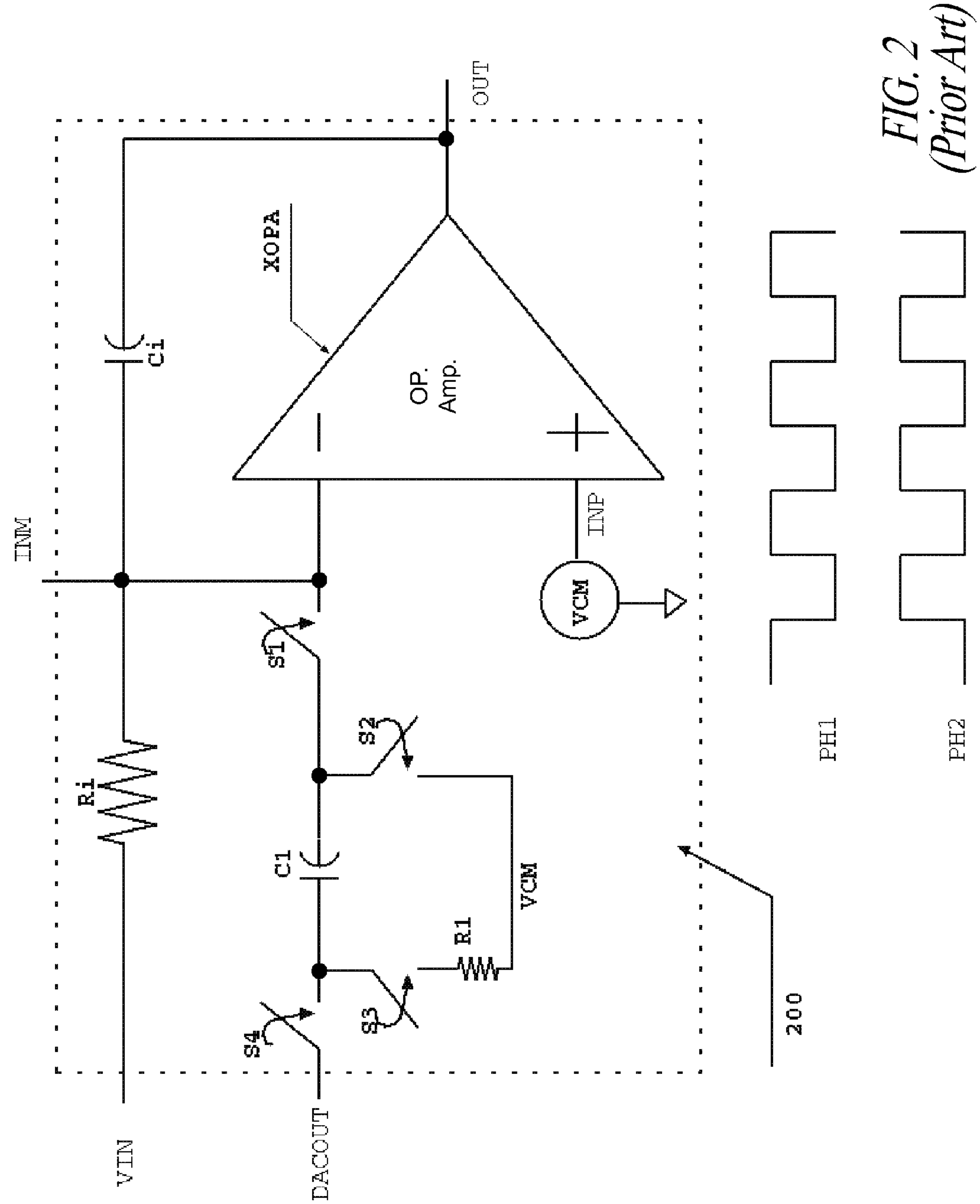
FIG. 2 (Prior Art)
FIG. 2 illustrates a schematic diagram of a conventional integrator.

The embodiments of the present disclosure are described in detail with reference to the accompanying drawings. However, the present disclosure is not limited to these embodiments which are only provided to explain more clearly the present disclosure to one of ordinary skill in the art of the present disclosure. In the accompanying drawings, like reference numerals are used to indicate like components.

The present disclosure provides a switched charge storage element integrator in continuous or discrete time circuits. The integrator prevents fold back of the wide band supply noise in the single ended implementation of a continuous time integrator with a discrete time feedback DAC. A dummy switched charge storage element branch is added so as to make the supply noise continuous and eliminate its dependency on the clock phases, thereby zeroing its convolution with the clock.

The present disclosure also provides a switched charge storage element integrator. The switched charge storage element integrator includes a differential input amplifier configured as an inverting integrator, a first switched charge storage element block periodically coupled to the inverting terminal INM of the amplifier by a coupling means or device S4, and a second switched charge storage element block identical to the first switched charge storage element block periodically coupled to the inverting terminal INM by a coupling means or device S8. The arrangement is provided in such a way that whenever the first switched charge storage element block is decoupled from the inverting terminal INM, the second switched charge storage element block is coupled to the terminal INM. In another arrangement, whenever the first switched charge storage element block is coupled to the inverting terminal INM, the second switched charge storage element block is decoupled from terminal INM.

The disclosure further provides a sigma delta modulator that includes a switched charge storage element integrator. The switched charge storage element integrator includes a differential input amplifier configured as an inverting integrator, a first switched charge storage element block periodically coupled to the inverting terminal INM of the amplifier by a coupling means or device S4, and a second switched charge storage element block, preferably of identical construction to the first switched charge storage element block, periodically coupled to the inverting terminal INM by a coupling means or device S8. The arrangement is provided in such a way that whenever the first switched charge storage element block is decoupled from the inverting terminal INM, the second switched charge storage element block is coupled to terminal INM. In another arrangement, whenever the first switched charge storage element block is coupled to the inverting terminal INM, the second switched charge storage element block is decoupled from terminal INM.

The disclosure further provides a system that includes a switched charge storage element integrator. The switched charge storage element integrator includes a differential input amplifier configured as an inverting integrator, a first switched charge storage element block periodically coupled to the inverting terminal INM of the amplifier by a coupling means or device S4, and a second switched charge storage element block identical to the first switched charge storage element block periodically coupled to the inverting terminal INM by a coupling means or device S8. The arrangement is provided in such a way that whenever the first switched charge storage element block is decoupled from the inverting terminal INM, the second switched charge storage element block is coupled to terminal INM. In another arrangement, whenever the first switched charge storage element block is coupled to the inverting terminal INM, the second switched charge storage element block is decoupled from terminal INM.

The disclosure also includes a method for avoiding convolution of supply noise with a clock signal in a switched charge storage element integrator. In the first step of the method, a first switched charge storage element block is periodically coupled to an inverting terminal INM of the integrator. In the second step of the method, a second identical switched charge storage element block is coupled to the inverting terminal INM for the duration for which the first switched charge storage element block is decoupled from the inverting terminal INM. This makes the supply noise continuous and eliminates its dependency on the clock phases thereby zeroing its convolution with the clock signal.

Figure 5:
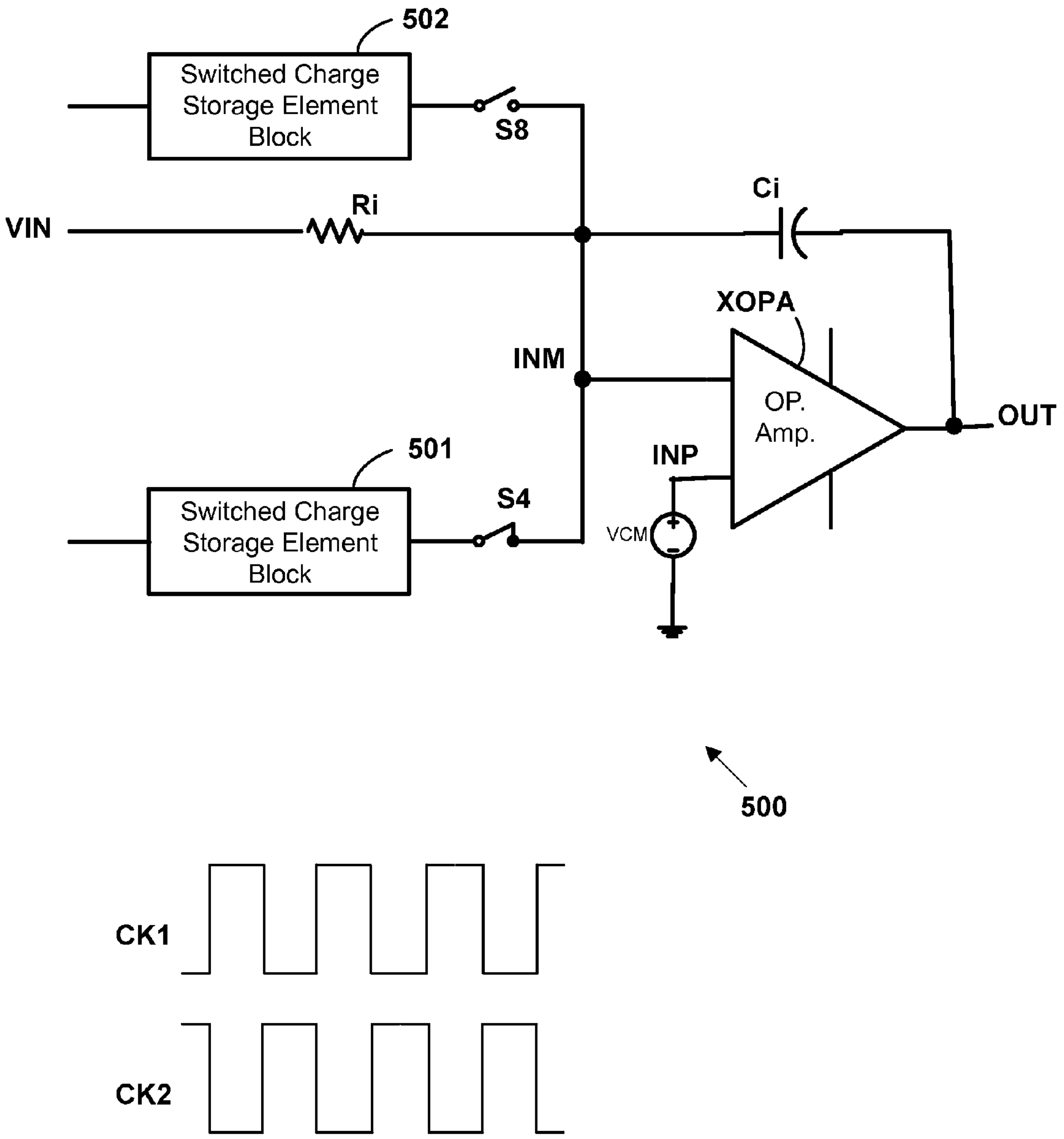
FIG. 5 illustrates a switched charge storage element integrator according to the present disclosure.

FIG. 5 illustrates a switched charge storage element integrator 500 according to the present disclosure. The integrator 500 includes a differential input amplifier XOPA, a first switched charge storage element block 501, and a second switched charge storage element block 502. The differential input amplifier XOPA is coupled to a capacitor Ci and a resistor Ri and is configured as an inverting integrator. The inverting terminal INM of the amplifier XOPA is coupled to controlled switches S4 and S8. The non-inverting terminal INP of the amplifier XOPA is coupled to a reference voltage VCM. First switched charge storage element block 501 is periodically coupled to the inverting terminal INM of the amplifier XOPA through the controlled switch S4 during the active state of a clock signal CK2. Second switched charge storage element block 502 is identical to the first switched charge storage element block 501. Second switched charge storage element block 502 is periodically coupled to the inverting terminal INM through the controlled switch S8 during the active state of a clock signal CK1. In one embodiment, the second clock signal CK2 is complementary to the first clock signal CK1.

Figure 6:
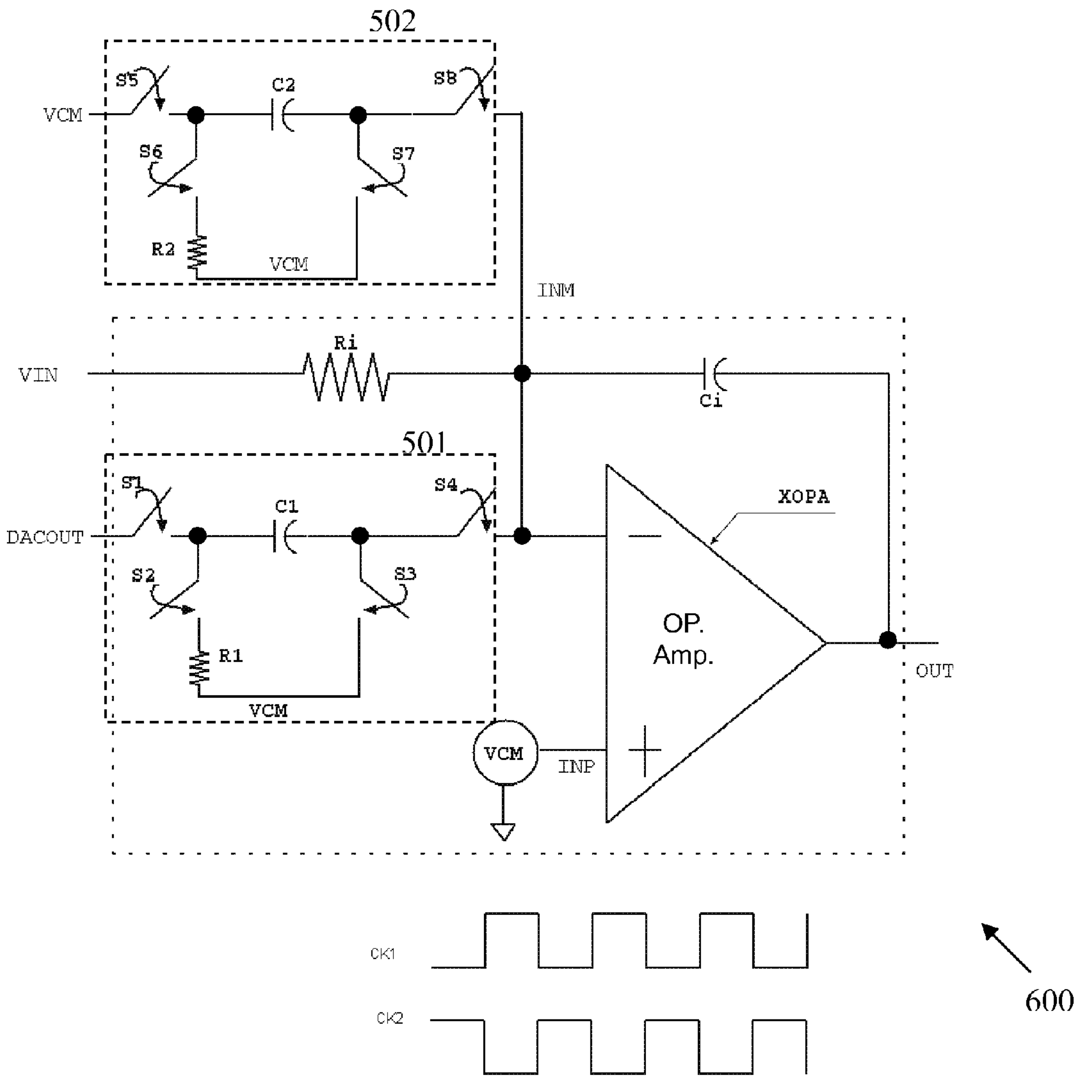
FIG. 6 illustrates a switched charge storage element integrator according to an embodiment of the present disclosure.

FIG. 6 illustrates a switched charge storage element integrator 600 according to the present disclosure. The first switched charge storage element block 501 includes a first 2-terminal charge storage element C1, and a plurality of controlled switches (S1 to S4).

The first controlled switch 51 is coupled to the first terminal of the first charge storage element C1. The first controlled switch 51 provides an input signal (DACOUT) to the first terminal of the first charge storage element C1 during the active state of a first clock signal CK1. The second controlled switch S2 is coupled to the first terminal of the first charge storage element C1. The second controlled switch S2 provides a reference voltage VCM to the first terminal of the first charge storage element C1 through a resistor R1 during an active state of second clock signal CK2. The third controlled switch S3 is coupled to the second terminal of the first charge storage element C1. The third controlled switch S3 provides the reference voltage VCM to the second terminal of the first charge storage element C1 during the active state of the first clock signal CK1.

The second switched charge storage element block 502 includes a second 2-terminal charge storage element C2, and a plurality of controlled switches (S5 to S8). The fifth controlled switch S5 is coupled to the first terminal of the second charge storage element C2. The fifth controlled switch S5 provides the reference voltage VCM to the first terminal of the second charge storage element C2 during the active state of the second clock signal CK2. The sixth controlled switch S6 is coupled to the first terminal of the second charge storage element C2. The sixth controlled switch S6 provides the reference voltage VCM to the first terminal of the second charge storage element C2 through a resistor R2 during the active state of the first clock signal CK1. The seventh controlled switch S7 is coupled to the second terminal of the second charge storage element C2. The seventh controlled switch S7 provides the reference voltage VCM to the second terminal of the second charge storage element C2 during the active state of the second clock signal CK2.

In this embodiment, the first 2-terminal charge storage element C1 and the second 2-terminal charge storage element C2 are capacitors.

During the active state of clock signal CK2, the fifth controlled switch S5 and seventh controlled switch S7 are "ON" thus discharging capacitor C2. During the active state of clock signal CK1, the first terminal of capacitor C2 is coupled to VCM and the second terminal is coupled to INM of operational amplifier XOPA. Hence during this period, the capacitor C2 transfers charge $C_2\times[VCM-V(INM)]$ to INM.

Since INM is the virtual ground of the operational amplifier XOPA, in an ideal scenario it is assumed that V(INM)=V (INP)=VCM (in the absence of noise source at INP). Hence charge transferred by the capacitor $C_2$ to Ci is 0.

The time period of the clock signals CK1 and CK2 is denoted as T and the rising edge of CK1 is assumed as beginning of a sample instance:

At the end of sample phase 'n' the output of integrator is:

$$V_{OUT}[n] = \left(\frac{C_1}{C_i}\right)\times\sum_{i=1}^{n} V_{DACOUT}[i] + \frac{1}{(R_iC_i)}\int V_{IN}(t)dt \tag{6}$$

The derived Equation (6) is exactly identical to equation (1)

Figure 7:
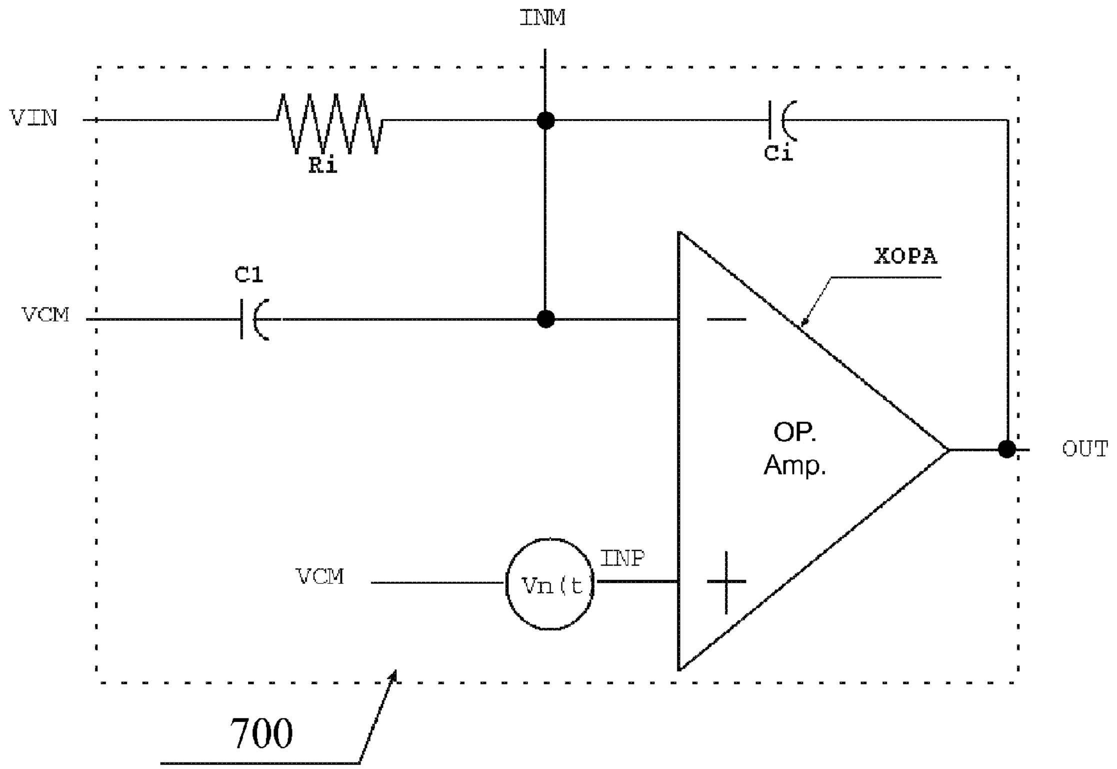
FIG. 7 illustrates a switched charge storage element integrator during the second clock signal CK2 according to an embodiment of the present disclosure.

FIG. 7 illustrates a switched charge storage element integrator 700 equivalent to the integrator 600 during the active state of clock signal CK2. The integrator 700 is eventually identical to the integrator circuit 400. During the active state of clock signal CK2, the capacitor C2, shown in FIG. 6, is not coupled to the terminal INM and hence has been removed from FIG. 7. Switch 51 is "ON" and couples the second terminal of capacitor C1 to INM. The first terminal of capacitor C1 is coupled to the reference voltage VCM.

The supply noise is introduced by means of a random noise source $V_n(t)$ applied at the positive input terminal INP. By mathematical manipulation, it is clear that the equivalent noise source referred at VIN during the second clock signal CK2 is approximated by the equation:

$$V_{neqph1}(t) = V_n(t)\times(1 + C_i/C_1) + (R_iC_i)\frac{d}{dt}V_n(t) \tag{7}$$

Figure 3:
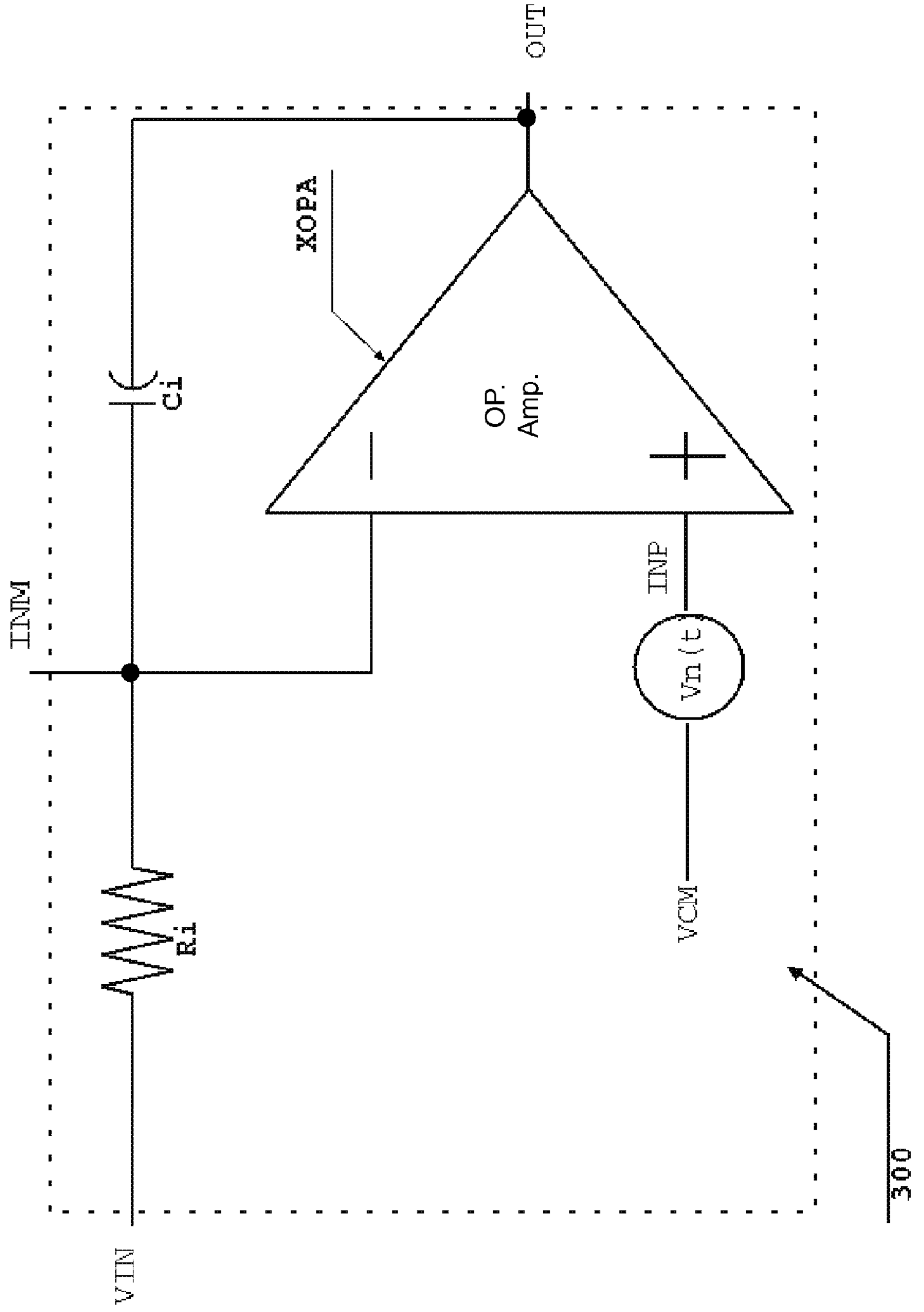
FIG. 3 (Prior Art)
FIG. 3 illustrates the conventional integrator during the phase PH2 active.
Figure 4:
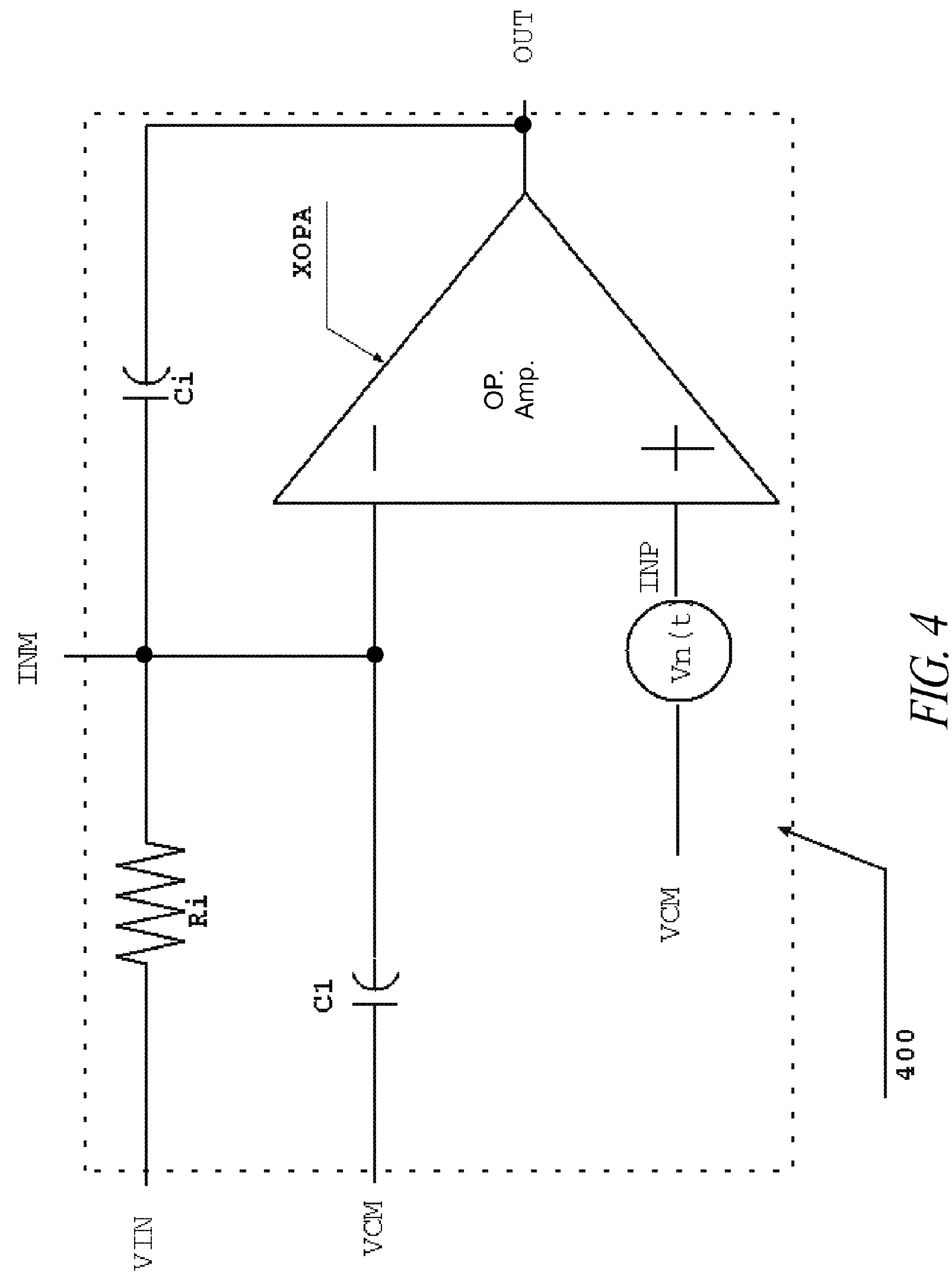
FIG. 4 (Prior Art)
FIG. 4 illustrates the conventional integrator during the phase PH1 active.
Figure 8:
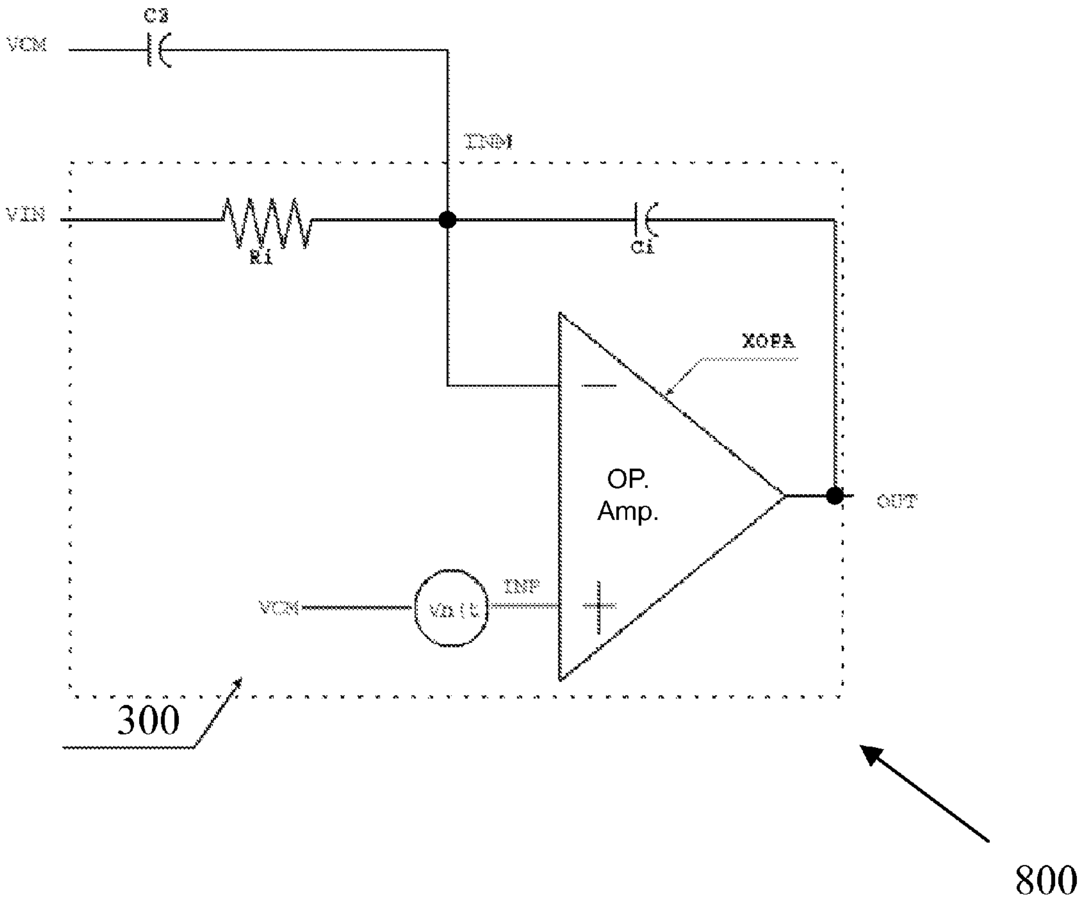
FIG. 8 illustrates a switched charge storage element integrator during the first clock signal CK1 according to an embodiment of the present disclosure.

FIG. 8 illustrates a switched charge storage element integrator 800 equivalent to the integrator 600 during the active state of clock signal CK1. Capacitor C1, shown in FIG. 6, is not coupled to the terminal INM and hence has been removed from FIG. 8. The integrator 800 includes a capacitor C2 connected between INM and VCM. The dotted portion 300 of FIG. 8 is equivalent to circuit shown in FIG. 3 during active state of clock signal CK1.

Again, by simple mathematical manipulation, it is clear that the equivalent noise source at VIN during the active state of the first clock signal CK1 is:

$$V_{neqph2}(t) = V_n(t)\times(1 + C_i/C_2) + (R_iC_i)\frac{d}{dt}V_n(t) \tag{8}$$

From equation (2) and (3):

Total equivalent noise at VIN is:

$$\begin{aligned} V_{neq}(t) &= V_{neqph2}(t)\times U(CK1) + V_{neqph1}(t)\times U(CK2) \\ U(CK1) &= 0 \text{ when } CK1 \text{ is LOW} \\ &= 1 \text{ when } CK1 \text{ is HIGH} \\ U(CK2) &= 0 \text{ when } CK2 \text{ is LOW} \\ &= 1 \text{ when } CK2 \text{ is HIGH} \end{aligned} \tag{9}$$

Since CK1 and CK2 are non-overlapping clocks, equation (9) can be re-written as $$\begin{aligned} V_{neq}(t) = V_n(t) + (R_iC_i)\frac{d}{dt}V_n(t) + \\ U(CK2)\times(V_n(t)\times C_i/C_1) + U(CK1)\times(V_n(t)\times C_i/C_2) \end{aligned} \tag{10}$$

Now if we make $C_i$=$C_2$=C, from equation (10)

$$V_{neq}(t) = V_n(t)\times(1 + C_i/C) + (R_iC_i)\frac{d}{dt}V_n(t),$$

which is completely a linear function of Vn(t) and its derivative.

The noise component does not produce any convolution with clock signals, and hence higher frequency noise spectrum does not fold back into the base band, resulting in overall robustness of the ADC with respect to substrate and supply noise.

Figure 9:
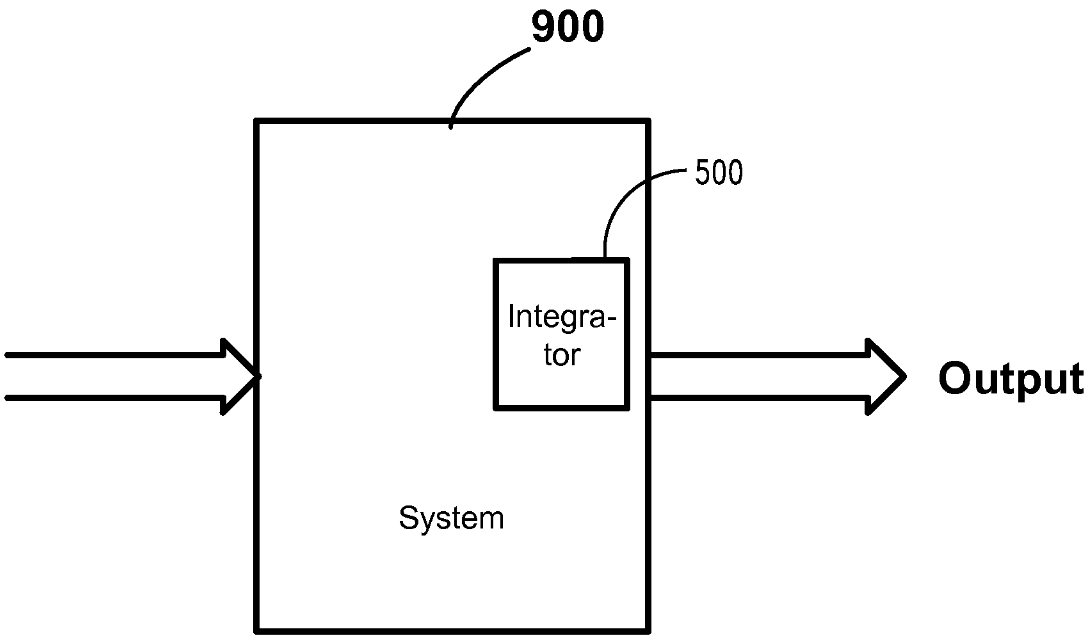
FIG. 9 illustrates a block diagram that discloses an application for a switched charge storage element integrator according to an embodiment of the present disclosure.

FIG. 9 illustrates a block diagram that discloses an application for a switched charge storage element integrator 500 that avoids convolution of a supply noise with a clock signal according to an embodiment of the present disclosure. System 900 includes a switched charge storage element integrator 500. The integrator 500 includes a differential input amplifier XOPA, a first switched charge storage element block 501, and a second switched charge storage element block 502. In one embodiment, the system 900 is a sigma delta modulator for encoding high resolution signals into low resolution signals using pulse-density modulation.

Figure 10:
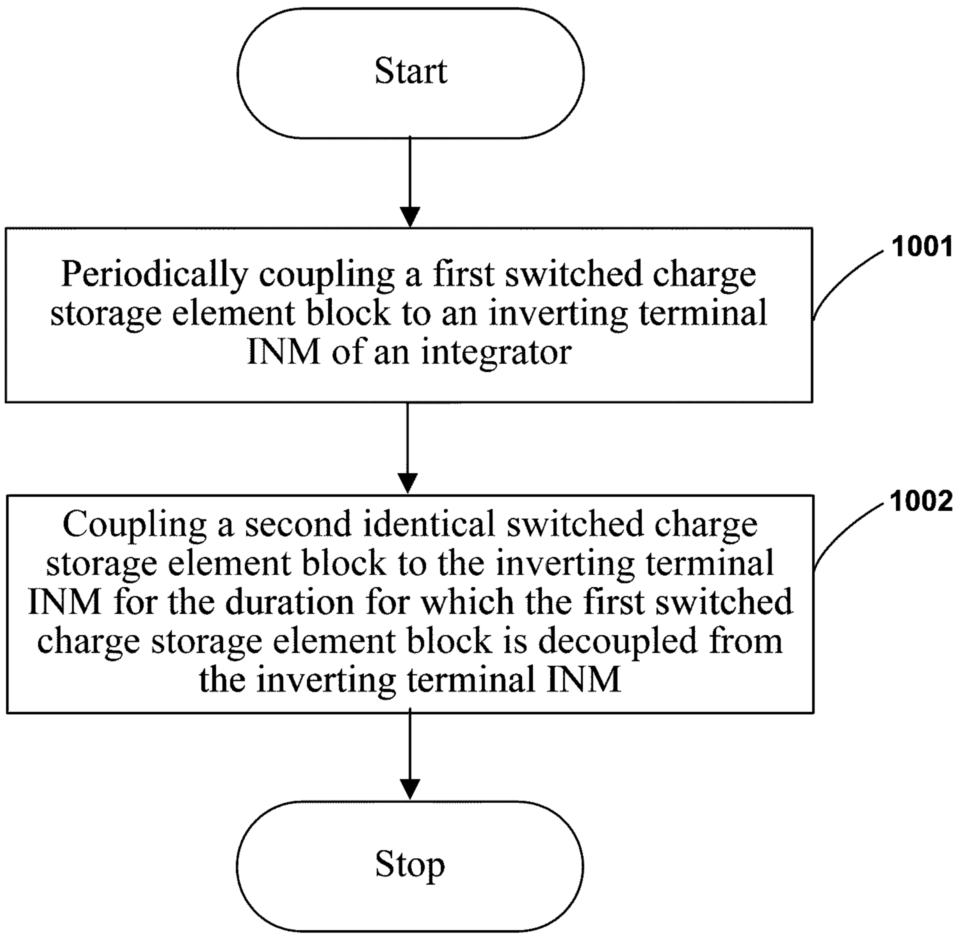
FIG. 10 illustrates a flow diagram of a method for avoiding convolution of supply noise with a clock signal in a switched charge storage element integrator according to an embodiment of the present disclosure.

Embodiments of the method for avoiding convolution of supply noise with a clock signal in a switched charge storage element integrator is described in FIG. 10. The method is illustrated as a collection of blocks in a logical flow graph, which represents a sequence of operations that can be implemented in hardware, software or a combination thereof. The order in which the process is described is not intended to be construed as a limitation, and any number of the described blocks can be combined in any order to implement the process or an alternate process.

FIG. 10 illustrates a flow diagram of a method for avoiding convolution of supply noise with a clock signal in a switched charge storage element integrator according to an embodiment of the present disclosure. The method explains two steps 1001 and 1002 for avoiding convolution of supply noise with the clock signal. The first switched charge storage element block 501 is periodically coupled to the inverting terminal INM of the integrator in step 1001. The second identical switched charge storage element block 502 is coupled to the inverting terminal INM for the duration for which the first switched charge storage element block 501 is decoupled from the inverting terminal INM in step 1002 for making the supply noise continuous and eliminating its dependency on the clock phases, thereby zeroing its convolution with the clock signal.

The embodiments of the present disclosure, relating to a switched charge storage element integrator in a continuous or discrete time circuit, are used in various applications, such as analog-to-digital and digital-to-analog converters, frequency synthesizers, switched-mode power supplies, and motor controls.

Although the disclosure of the switched charge storage element integrator in a continuous or discrete time circuit has been described in connection with various embodiments of the present disclosure illustrated in the accompanying drawings, it is not limited thereto. It will be apparent to those skilled in the art that various substitutions, modifications and changes may be made thereto without departing from the scope and spirit of the disclosure.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

We claim:

1. A system, comprising:

a switched charge storage element integrator, the integrator including:

a first input terminal configured to receive a reference voltage;

a second input terminal configured to receive a first analog input signal;

a third input terminal configured to receive a second analog input voltage;

a differential input amplifier having a non-inverting input terminal and an inverting input terminal that is continuously electrically coupled to the second input terminal to receive the first analog input signal;

a first switched charge storage element block having first and second terminals;

a first coupling circuit configured to periodically electrically couple the inverting terminal of the differential input amplifier to the first terminal of the first switched charge storage element block and the second terminal of the first switched charge storage element to the first input terminal;

a second switched charge storage element block having first and second terminals; and a second coupling circuit configured to periodically electrically couple the inverting terminal of the differential input amplifier to the first terminal of the second switched charge storage element block and the second terminal of the second switched charge storage element block to the third input terminal, the first and second coupling circuits configured so that whenever the first switched charge storage element block is electrically decoupled from the inverting terminal of the differential input amplifier and the first input terminal, the second switched charge storage element block is electrically coupled to the inverting terminal of the differential input amplifier and the third input terminal, and whenever the first switched charge storage element block is electrically coupled to the inverting terminal of the differential input amplifier and the first input terminal, the second switched charge storage element block is electrically decoupled from the inverting terminal of the differential input amplifier and the third input terminal.

2. The system as claimed in claim 1 wherein the first switched charge storage element block comprises:

a first 2-terminal charge storage element;

a first controlled switch configured to electrically couple the first terminal of the first switched charge storage element block to the first input terminal during an active state of a first clock signal;

a second controlled switch configured to electrically couple the first terminal of the first switched charge storage element block to a reference voltage node during an active state of a second clock signal; and a third controlled switch configured to electrically couple the second terminal of the first switched charge storage element block to the reference voltage node during the active state of the first clock signal.

3. The system as claimed in claim 2 wherein the second switched charge storage element block comprises:

a second 2-terminal charge storage element;

a fourth controlled switch configured to electrically couple the first terminal of the second switched charge storage element block to the third input terminal during the active state of the second clock signal;

a fifth controlled switch configured to electrically couple the first terminal of said second switched charge storage element block to the reference voltage node during the active state of the first clock signal; and a sixth controlled switch configured to electrically couple the second terminal of the second switched charge storage element block to the reference voltage node during the active state of the second clock signal.

4. A sigma delta modulator, comprising:

a switched charge storage element integrator, the integrator including:

a first input terminal configured to receive a reference voltage;

a second input terminal configured to receive a first analog input signal;

a third input terminal configured to receive a second analog input signal;

a differential input amplifier having a non-inverting input terminal and an inverting terminal that is continuously electrically coupled to the first input terminal;

a first switched charge storage element block having first and second terminals;

a first coupling circuit having first and second controlled switches configured to periodically electrically couple the inverting terminal of the differential input amplifier to the first terminal of the first switched charge storage element block and the second terminal of the first switched charge storage element block to the first input node, respctively;

a second switched charge storage element block having first and second terminals; and a second coupling circuit having third and fourth controlled switches configured to periodically electrically couple the inverting terminal of the differential input amplifier to the first terminal of the second switched charge storage element block and the second terminal of the second switched storage element block to the third input node, respectively, the first and second coupling circuits configured so that whenever the first switched charge storage element block is electrically decoupled from the inverting terminal of the differential input amplifier and the first input node, the second switched charge storage element block is electrically coupled to the inverting terminal of the differential input amplifier and the third input node, and whenever the first switched charge storage element block is electrically coupled to the inverting terminal of the differential input amplifier and the first input node, the second switched charge storage element block is electrically decoupled from the inverting terminal of the differential input amplifier and the third input node.

5. The sigma delta modulator as claimed in claim 4 wherein the first switched charge storage element block comprises:

a first 2-terminal charge storage element;

a first controlled switch configured to electrically couple the first terminal of the first switched charge storage element block to the first input terminal during an active state of a first clock signal;

a second controlled switch configured to electrically couple the first terminal of the first switched charge storage element block to a reference voltage node during an active state of a second clock signal; and a third controlled switch configured to electrically couple the second terminal of the first switched charge storage element block to the reference voltage node during the active state of the first clock signal.

6. The sigma delta modulator as claimed in claim 5 wherein the second switched charge storage element block comprises:

a second 2-terminal charge storage element;

a fourth controlled switch configured to electrically couple the first terminal of the second switched charge storage element block to the third input terminal during the active state of the second clock signal;

a fifth controlled switch configured to electrically couple the first terminal of the second switched charge storage element block to the reference voltage node during the active state of the first clock signal; and a sixth controlled switch configured to electrically couple the second terminal of the second switched charge storage element block to the reference voltage node during the active state of the second clock signal.

7. A switched charge storage element integrator, comprising:

a first input terminal configured to receive a reference voltage;

a second input terminal configured to receive a first analog input signal;

a third input terminal configured to receive a second analog input signal;

a differential input amplifier having a non-inverting input terminal and an inverting input terminal continuously electrically coupled to the second input terminal;

a first switched charge storage element block having first and second terminals;

a first coupling circuit configured to periodically electrically couple the inverting terminal of the differential input amplifier to the first terminal of the first switched storage element block and the second terminal of the first switched charge storage element block to the first input terminal;

a second switched charge storage element block having first and second terminals; and a second coupling circuit configured to periodically electrically couple the inverting terminal of the differential input amplifier to the first terminal of the second switched charge storage element block and the second terminal of the second switched charge storage element block to the third input node whenever the first switched charge storage element block is decoupled from the inverting terminal of the differential input amplifier and the first input terminal, and to uncouple the first terminal of the second switched charge storage element block from the inverting terminal of the differential input amplifier and the second terminal from the third input terminal whenever the first switched charge storage element block is coupled to the inverting terminal of the differential input block and the first input terminal.

8. The integrator as claimed in claim 7 wherein the first switched charge storage element block comprises:

a first 2-terminal charge storage element;

a first controlled switch configured to electrically couple the first terminal of the first switched charge storage element block to the first input terminal during an active state of a first clock signal;

a second controlled switch configured to electrically couple the first terminal of the first switched charge storage element block to a reference voltage node during an active state of a second clock signal; and a third controlled switch configured to electrically couple the second terminal of the first switched charge storage element block to the reference voltage node during the active state of the first clock signal.

9. The integrator as claimed in claim 7 wherein the second switched charge storage element block comprises:

a second 2-terminal charge storage element;

a fourth controlled switch configured to electrically couple the first terminal of the second charge storage element to the third input terminal during the active state of the second clock signal;

a fifth controlled switch configured to electrically couple the first terminal of the second switched charge storage element block to the reference voltage node during the active state of the first clock signal; and a sixth controlled switch configured to electrically couple the second terminal of the second switched charge storage element block to the reference voltage node during the active state of the second clock signal.

10. A method for avoiding convolution of supply noise with a clock signal in a switched charge storage element integrator, the method comprising:

continuously electricallv coupling a first input terminal of the switched charge storage element integrator to an inverting input of a differential input amplifier in the switched charge storage element integrator to input a first analog input signal to the differential input amplifier;

periodically coupling a first switched charge storage element block to the inverting terminal of the differental input amplifier and simulatnaeously to a reference input terminal to receive a reference voltage; and coupling a second switched charge storage element block to the inverting terminal of the differntial input amplifier and simultaneously to a second input terminal to receive a second analog input signal for a duration for which the first switched charge storage element block is decoupled from the inverting terminal of the differential input amplifier and the reference input terminal.

11. The method of claim 10, comprising controlling first and second switch circuits to alternatingly couple the first and second switched charge storage element blocks to the inverting input of the differential input amplifier and to the respective reference and second input terminals.

12. The method of claim 10 wherein the first and second switched charge storage element blocks have substantially identical construction.

13. A circuit, comprising:

a switched charge storage element integrator that includes;

a reference voltage terminal configured to receive a reference voltage;

a first input terminal configured to receive a first analog input signal;

a secdond input terminal configured to receive a second analog input signal;

a differential input amplifier having an inverting terminal continuously electrically coupled to the first terminal and having a non-inverting terminal continuously electrically coupled to the a reference voltage source;

first and second switched charge storage element circuits, each having first and second terminals; and first and second coupling circuits coupled to the respective first and second switched charge storage element circuits, to the reference voltage terminal and second input terminal, respectively, and to the inverting terminal of the differential input amplifier and configured to alternatingly couple the first and second switched charge storage element circuits to the differential input amplifier and the respective reference voltage terminal and second input terminal so that whenever the first switched charge storage element circuit is coupled to the inverting integrator and the reference voltage terminal, the second switched charge storage element circuit is decoupled from the inverting integrator and the second input terminal, and whenever the second switched charge storage element circuit is coupled to the inverting terminal of the differential amplifier and to the second input terminal, the first switched charge storage element circuit is decoupled from the inverting terminal of the differential amplifier and the reference voltage terminal.

14. The circuit of claim 13 wherein the first and second switched charge storage element circuits are substantially identical in their construction.

15. The circuit of claim 13 wherein the first switched charge storage element circuit comprises:

a first 2-terminal charge storage element circuit;

a first controlled switch configured to electrically couple the first terminal of the first switched charge storage element circuit to the reference voltage terminal during an active state of a first clock signal;

a second controlled switch configured to electrically couple the first terminal of the first switched charge storage element circuit to a reference voltage node during an active state of a second clock signal;

a third controlled switch configured to electrically couple the second terminal of the first switched charge storage element circuit to the reference voltage node during the active state of the first clock signal; and wherein the second switched charge storage element circuit comprises:

a second 2-terminal charge storage element circuit;

a fourth controlled switch configured to electrically couple the first terminal of the second switched charge storage element circuit to the second input terminal during the active state of the second clock signal;

a fifth controlled switch configured to electrically couple the first terminal of the second switched charge storage element circuit to the reference voltage node during the active state of the first clock signal; and a sixth controlled switch configured to electrically couple the second terminal of the second switched charge storage element circuit to the reference voltage node during the active state of the second clock signal.

* * * * *